US008296694B1

(12) United States Patent
Chakravadhanula et al.

(10) Patent No.: US 8,296,694 B1
(45) Date of Patent: Oct. 23, 2012

(54) SYSTEM AND METHOD FOR AUTOMATED SYNTHESIS OF CIRCUIT WRAPPERS

(75) Inventors: Krishna V. Chakravadhanula, Vestal, NY (US); Vivek Chickermane, Ithaca, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 354 days.

(21) Appl. No.: 12/649,816

(22) Filed: Dec. 30, 2009

(51) Int. Cl.
*G06F 17/50* (2006.01)

(52) U.S. Cl. .......................... 716/103; 716/104

(58) Field of Classification Search .................. 716/103, 716/104, 106, 136; 714/734, 726, 727, 729; 324/537

See application file for complete search history.

(56) References Cited

U.S. PATENT DOCUMENTS

| | | | |
|---|---|---|---|
| 2007/0255986 A1 | 11/2007 | Chang et al. | |
| 2008/0034262 A1* | 2/2008 | Whetsel | 714/729 |
| 2008/0290878 A1* | 11/2008 | Waayers | 324/537 |
| 2011/0066602 A1* | 3/2011 | Studer et al. | 707/690 |

OTHER PUBLICATIONS

Yervant Zorian, Erik Jan Marinissen, Sujit Dey; Testing Embedded-Core Based System Chips, International Test Conference, 1998 IEEE, pp. 130-143.

Alfredo Benso, Stefano Di Carlo, Paolo Prinetto, Yervant Zorian; IEEE Standard 1500 Compliance Verification for Embedded Cores, IEEE Transactions on Very Large Scale Integration (VLSI) Systems, vol. 16, No. 4. Apr. 2008, pp. 397-407.

H.J, Vermaak, H.G. Kerkhoff; Enhanced P1500 Compliant Wrapper suitable for Delay Fault Testing of Embedded Cores, Proceedings of the Eighth IEEE European Test Workshop (ETW 2003).

Michael Higgins, Ciaran MacNamee, Brendan Mullane; A Novel System on Chip (SoC) Test Solution, IEEE Computer Society Annual Symposium on VLSI, 2008 IEEE, pp. 145-150.

D. Appello, V. Tancorre, P. Bernardi, M, Grosso, M. Rebaudengo, M. Sonza Reorda; On the Automation of the Test Flow of Complex SoCs, Proceedings of the 24th IEEE VLSI Test Symposium (VTS 2006).

Tom Waayers, Richard Morren, Roberto Grandi; Definition of a robust Modular SOC Test Architecture; Resurrection of the single TAM daisy-chain, International Test Conference, 2005 IEEE, pp. 1-10.

Qiang Xu, Yubin Zhang, Krishnendu Chakrabarty; Test-Wrapper Designs for the Detection of Signal-Integrity Faults on Core-External of SoCs, International Test Conference, 2007 IEEE, pp. 1-10.

Krishnendu Chakrabarty; Design of System-on-a-Chip Test Access Architectures under Place-and-IRoute and Power Constraints, IEEE Xplore, Downloaded on Jul. 12, 2009, pp. 432-437.

Sandeep Kumar Goel, Erik Jan Marinissen; Effective and Efficient Test Architecture Design for SOCs, ITC International Test Conference, 2002 IEEE, pp. 529-538.

Anuja Sehgal, Sandeep Kumar Goel, Erik Jan Marinissen, Krishnendu Chakrabarty; IEEE P1500—Compliant Test Wrapper Design for Hierarchical Cores, ITC International Test Conference, 2004 IEEE, pp. 1203-1212.

(Continued)

*Primary Examiner* — Vuthe Siek
(74) *Attorney, Agent, or Firm* — Kenyon & Kenyon LLP

(57) ABSTRACT

Various embodiments of the present invention provide for automated synthesizing of a circuit wrapper for an integrated circuit element. Specifically, some embodiments of the invention provide computer-aided design (CAD) support for automated circuit wrapper generation, especially circuit test wrappers. Additionally, various embodiments of the invention result in optimally designed and segmented circuit wrappers that are configured for both parallel instruction mode and serial instruction mode.

33 Claims, 6 Drawing Sheets

OTHER PUBLICATIONS

Vikram Iyengar, Krishnendu Chakrabarty, Erik Jan Marinissen; Test Wrapper and Test Access Mechanism Co-Optimization for System-on-Chip, ITC International Test Conference, 2001 IEEE, pp. 1023-1032.

Erik Jan Marinissen, Sandeep Kumar Goel, Maurice Lousberg; Wrapper Design for Embedded Core Test, ITC International Test Conference, 2000 IEEE, pp. 911-920.

* cited by examiner

20 {
Functional inputs a[1:0]   core_use=input   segment_id={WP_INTEST=1.WP_EXTEST=1}   wpr_cell=WC_SD1_CII
b[1:0]   core_use=input   segment_id={WP_INTEST=1.WP_EXTEST=2}   wpr_cell=WC_SD1_CII
}

21 {
Scan I/O's

NO_CONNECT core_test_use_only=scan_in    core_in=SI1   segment_id={WP_INTEST=3}
     scan_chain=chain1   scan_clock={clock}
NO_CONNECT core_test_use_only=scan_out   core_out=SO1  segment_id={WP_INTEST=3}
     scan_chain=chain1

NO_CONNECT core_test_use_only=scan_in    core_in=SI2   segment_id={WP_INTEST=2}
     scan_chain=chain2
NO_CONNECT core_test_use_only=scan_out   core_out=SO2  segment_id={WP_INTEST=2}
     scan_chain=chain2   scan_clock={clock}
}

22 {
Functional outputs out[2]   core_use=output   segment_id={WP_INTEST=1.WP_EXTEST=1}   wpr_cell=WC_SD1_CII
out[1]   core_use=output   segment_id={WP_INTEST=1.WP_EXTEST=1}   wpr_cell=WC_SD1_CII
out[0]   core_use=output   segment_id={WP_INTEST=1.WP_EXTEST=2}   wpr_cell=WC_SD1_CII
}

Pins required for wrapper functionality

23 {
wpi[2]   wpr_use=parallel_in    segment_id={WP_INTEST=3}
wpi[1]   wpr_use=parallel_in    segment_id={WP_INTEST=2.WP_EXTEST=2}
wpi[0]   wpr_use=parallel_in    segment_id={WP_INTEST=1.WP_EXTEST=1}
wpo[2]   wpr_use=parallel_out   segment_id={WP_INTEST=3}
wpo[1]   wpr_use=parallel_out   segment_id={WP_INTEST=2.WP_EXTEST=2}
wpo[0]   wpr_use=parallel_out   segment_id={WP_INTEST=1.WP_EXTEST=1}
}

Section describing wrapper functionality
IOSpecifyData=WRAPPER_Inline

24 {
WIR    LENGTH=4    CAPTURE={0,0,1,1}
WBY    LENGTH=1
}

25 {
INSTRUCTION  NAME=WS_INTEST_SCAN  OPCODE=0111
INSTRUCTION  NAME=WS_EXTEST       OPCODE=1001
INSTRUCTION  NAME=WP_EXTEST
INSTRUCTION  NAME=WP_INTEST
}
WRAPPER_Inline

FIG. 2

| Instructions | $WC_1$ | $WC_2$ | $SC_1$ | $SC_2$ | $WC_3$ | $WC_4$ |
|---|---|---|---|---|---|---|
| WP_EXTEST (I1) | WPI[0] | WPI[0] | -1 | -1 | WPI[1] | WPI[2] |
| WP_INTEST (I2) | WPI[0] | WPI[0] | WPI[1] | WPI[2] | WPI[0] | WPI[0] |
| WS_INTEST_RING (I3) | WSI | WSI | -1 | -1 | WSI | WSI |
| WS_INTEST_SCAN (I4) | WSI | WSI | WSI | WSI | WSI | WSI |
| WS_EXTEST (I5) | WSI | WSI | -1 | -1 | WSI | WSI |

FIG. 5

| Instructions | WC1 | WC2 | WC3 | WC4 | SC1 | SC2 | WC5 | WC6 | WC7 |
|---|---|---|---|---|---|---|---|---|---|
| WP_EXTEST | WPI[0] | WPI[0] | WPI[1] | WPI[1] | -1 | -1 | WPI[1] | WPI[0] | WPI[0] |
| WP_INTEST | WPI[0] | WPI[0] | WPI[0] | WPI[0] | WPI[1] | WPI[2] | WPI[0] | WPI[0] | WPI[0] |
| WS_INTEST_RING | WSI | WSI | WSI | WSI | -1 | -1 | WSI | WSI | WSI |
| WS_INTEST_SCAN | WSI | WSI | WSI | WSI | WSI | WSI | WSI | WSI | WSI |
| WS_EXTEST | WSI | WSI | WSI | WSI | -1 | -1 | WSI | WSI | WSI |

FIG. 6A

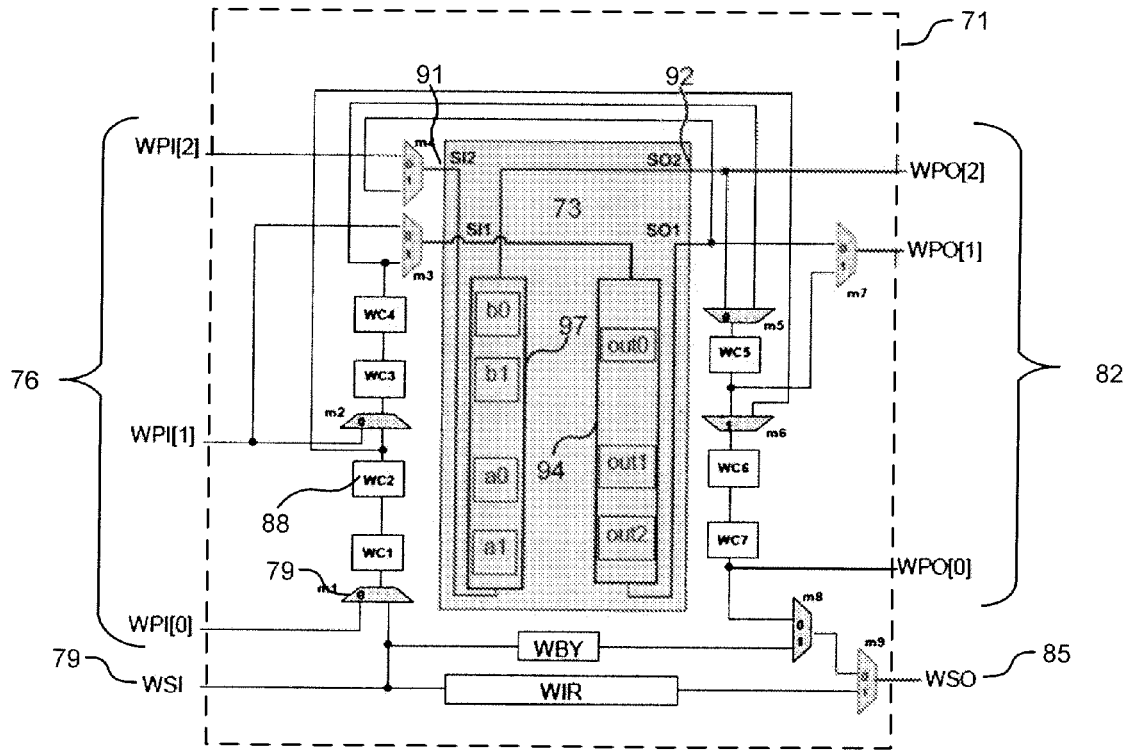

FIG. 6B

SYSTEM AND METHOD FOR AUTOMATED SYNTHESIS OF CIRCUIT WRAPPERS

FIELD OF THE INVENTION

The present invention relates to circuit design and, more particularly, to systems and methods for generating logic wrappers for integrated circuit designs.

DESCRIPTION OF THE RELATED ART

A system-on-chip (also referred to as system-on-a-chip or SoC) is an integrated circuit where all the components of an electronic system are integrated into a single integrated chip. Some components of a system-on-chip include one or more microcontroller, microprocessor, or digital-signal-processor (DSP) cores (circuit cores), memory blocks, timing sources, various interfaces, and various peripherals. Due to the design complexity of system-on-chip, numerous methods for testing such designs have been developed over the years. For example, Design for Testability (DFT) is one method that adds certain testability features to a circuit design to make it easier to develop tests for and apply tests to the resulting circuit. Automatic Test Pattern Generation (ATPG) is another method for testing an entire system-on-chip using brute-force test pattern generation. A more focused approach to test pattern generation includes only generating test patterns for specific cores (circuit cores) within a system-on-chip. This technique is used by some third parties, who sometimes pre-configure their black-box cores with test patterns along the core boundaries (e.g., ARM® ETM9™). Yet other example testing methods include use of scan chains, and use of test compression (i.e., use of compression and decompression structures). Eventually, in response to the complexities encountered in the above methods, standards such as the IEEE 1500 architecture standard developed.

The IEEE 1500 standard teaches wrapping circuit cores within a system-on-chip in a IEEE-1500-compliant logic, called a wrapper, for testing purposes. The wrapper (also referred to as the core test wrapper, core wrapper, or simply the test wrapper) provides serial and parallel test mechanisms (also referred to as test access mechanisms or TAMs) to the core contained within the wrapper. By operating in accordance with test instructions provided to the wrapper via a Wrapper Instruction Register (WIR), the test access mechanisms enable both parallel and serial access to the pins of the core within the wrapper and thereby allow for easier core accessibility for testing and reuse purposes.

According to the IEEE 1500 standard, a Wrapper Boundary Cell (WBC) is placed on each functional pin of a core, with the Wrapper Boundary Cells forming the Wrapper Boundary Registers (WBRs). Two forms of access are defined by the standard: (1) a Wrapper Serial Port (WSP) consisting of a single scan-in designated Wrapper Serial Input (WSI) and a single scan-out port designated Wrapper Serial Output (WSO), and (2) a Wrapper Parallel Port (WPP) consisting of multiple Wrapper Parallel Input (WPI) and Wrapper Parallel Output (WPO) terminals (e.g., pins). The Wrapper Boundary Registers are implemented such that they may be configured for parallel instructions at one moment, and configured for serial instruction at another. The current configuration of the Wrapper Boundary Registers are determined based on the current instruction loaded into the Wrapper Instruction Register.

When configured for serial instruction, the Wrapper Boundary Register operates as a single serial shift register (also known as a single scan chain or referred to as a scan segment) consisting of all the Wrapper Boundary Cells (WBCs). Serial access to the Wrapper Boundary Register is facilitated via the Wrapper Serial Input and Wrapper Serial Output terminals. When configured for parallel instruction, the Wrapper Boundary Register is split up into multiple scan chains (also known as multiple scan segments) where the scan chains are built in parallel and accessible via the Wrapper Parallel Input and Wrapper Parallel Output terminals. During parallel instructions, the number and size of Wrapper Boundary Register segments vary from instruction to instruction.

Unfortunately, as the number of circuit input/outputs (I/Os) that need accessing (e.g., number of I/Os that need testing) increases, so does the complexity of the circuit wrapper used on those input/outputs. This is especially true in terms of the number and size of segments used within the wrapper. Further, the need for optimal segmentation within a circuit wrapper is key for efficient testing and smaller integrated circuit sizes. Optimal segmentation is also difficult to achieve if the wrapper is manually designed.

BRIEF SUMMARY OF EMBODIMENTS OF THE INVENTION

The present invention provides various embodiments for automated synthesizing of a circuit wrapper for an integrated circuit element. Specifically, some embodiments of the invention provide computer-aided design (CAD) support for automated circuit wrapper generation, especially circuit test wrappers. For example, various embodiments of the invention can be implemented into Electronic Design Automation (EAD) tools (also referred to as electronic computer-aided design (ECAD) tools) to reduce the complexity and difficulty in designing a circuit test wrapper for a given circuit. Additionally, various embodiments of the invention result in optimally designed and segmented circuit wrappers that are configured for both parallel instruction mode and serial instruction mode.

According to one embodiment of the invention, a computer-implemented method for generating a circuit wrapper for an integrated circuit element is provided, the method comprising: receiving at a computer system a first dataset describing an integrated circuit element, wherein the first dataset describes at least one input specification and at least one output specification of the integrated circuit element; receiving at the computer system a second dataset describing a mapping relationship (or requirement) between the circuit wrapper and the integrated circuit element, wherein the circuit wrapper comprises a wrapper instruction register for loading a wrapper instruction, a wrapper input, and a wrapper output, the second dataset defines a set of wrapper instructions, and the mapping relationship maps for a wrapper instruction from the set of wrapper instructions the wrapper input to at least one integrated circuit input and the wrapper output to at least one integrated circuit output; and generating at the computer system the circuit wrapper using the first and second datasets, wherein a table is generated from the first and second dataset and traversed in order to implement the mapping into the circuit wrapper by using control logic to multiplex the wrapper input and the wrapper output. In some such embodiments, the circuit wrapper generated is in accordance with IEEE 1500. In additional such embodiments, the integrated circuit element may be an entire integrated circuit or a circuit core of a system-on-chip.

Depending on the embodiment, the wrapper input may be a wrapper parallel input or a wrapper serial input, and the wrapper output may be a wrapper parallel output or a wrapper serial output. Additionally, the integrated circuit input or the integrated circuit output may be an input scan chain, an output scan chain, an input pin, or an output pin.

In some embodiments, a set CI of y input wrapper cells connects the integrated circuit input to the circuit wrapper and a set CO of u number of output wrapper cells connects the integrated circuit output to the circuit wrapper. In some such embodiments, the set of input wrapper cells form a wrapper input register and the set of output wrapper cells form a wrapper output register. It should be noted that in some embodiments the set of input wrapper cells CI and the set of output wrapper cells CO are not mutually exclusive and, therefore, certain wrapper cells will function as both an input and output for those integrated circuit element pins that function as both input and output (i.e., bidirectional). Additionally, wrapper cells may be used both with functional pins of the integrated circuit element and with scan chain (i.e., serial) inputs and outputs of the integrated circuit element. With respect to scan chain inputs and outputs, a wrapper cell may be placed on a scan pin, or a wrapper cell may be connected to a scan pin such that data can be sent to and/or received from the scan pin.

In further embodiments, generating the circuit wrapper comprises: generating and placing within the circuit wrapper a first control logic in accordance with the second dataset, wherein the first control logic is controlled by a wrapper instruction presently loaded in the wrapper instruction register, the first control logic is placed between the set CI of input wrapper cells and the wrapper input, and the first control logic implements a mapping between the wrapper input and input of the integrated circuit element via the set CI of input wrapper cells; and generating and placing within the circuit wrapper a second control logic in accordance with the second dataset, wherein the second control logic is controlled by a wrapper instruction presently loaded in the wrapper instruction register, the second control logic is placed between set CO of output wrapper cells and the wrapper output, and the second control logic implements a mapping between the wrapper output and output of the integrated circuit element via the set CO of output wrapper cells. When implementing the first control logic and second control logic, some embodiments utilize multiplexers, AND gates, OR gates, NAND gates, NOR gates, or some combination thereof.

In other embodiments, generating the first control logic according to the first and second dataset comprises: generating from the wrapper input a set WI of x number of wrapper input elements whose outputs map to the set CI of input wrapper cells; generating the table T, wherein each entry $T(m,n)$ of the table indicates a relationship between a wrapper input element $WI_p$ and an input wrapper cell $CI_n$ for a given wrapper instruction $I_m$; determining from the table T an input logic equation for each input wrapper cell $CI_n$ within the set CI such that the input logic equation maps wrapper input elements of the set WI to input wrapper cell $CI_n$, thereby resulting in a plurality of input logic equations that map wrapper input elements of the set WI to input wrapper cells of the set CI; and generating the first control logic according to the plurality of input logic equations.

In further embodiments, determining from the table T an input logic equation for each input wrapper cell $CI_n$ within the set CI (from n=1 to x) comprises: creating a temporary input list tmp_in, wherein the temporary input list is initially empty for each input wrapper cell $CI_n$; performing for each wrapper instruction $I_m$ from m=1 to z where the following operations: attempting to locate a closest previous wrapper cell $CI_i$ where i<n and $T(m,n)$ is the same as $T(m,i)$, adding $T(m,n)$ to the temporary input list tmp_n if $CI_i$ is not located and $T(m,n)$ has not already been added to the temporary input list tmp_in, and adding $CI_i$ to the temporary input list tmp_in if $CI_i$ is located and $C_j$ has not already been added to the temporary input list tmp_in; and determining that the logic equation for the input wrapper cell $C_n$ is $T(m, n)$ if the temporary list tmp_in contains only one element; and determining that the input logic equation for the input wrapper cell $C_n$ is the elements of the temporary input list tmp_in multiplexed together if there is more than one element in the temporary input list tmp_in. Depending on the embodiment, the elements of the temporary input list tmp_in may be multiplexed together using multiplexers, or using an OR-AND-OR gate network.

In yet further embodiments, generating the second control logic according to the first and second dataset comprises: generating from the wrapper output a set WO of t number of wrapper output elements whose inputs map to the set CO of output wrapper cells; determining from the table T an output logic equation for each wrapper output element $WO_p$ within the set WO such that the output logic equation maps wrapper output element $WO_p$ to output wrapper cells of the set CO, thereby resulting in a plurality of output logic equations that map wrapper output elements of the set WO to output wrapper cells of the set CO; and generating the second control logic according to the plurality of output logic equations.

In another embodiment, determining from the table T an output logic equation for each wrapper output element $WO_p$ within the set WO (from p=1 to t) comprises: creating a temporary output list tmp_out, wherein the temporary output list is initially empty for each wrapper output element $WO_p$; performing for each wrapper instruction $I_m$ from m=1 to z where the following operations: attempting to locate a last entry $T(m,j)$ where $j \leq y$ and the wrapper input element $WI_o$ within $T(m,j)$ corresponds to the wrapper output element $WO_p$, and adding $C_j$ to the temporary output list tmp_out if $C_j$ is located and $C_j$ has not already been added to the temporary output list tmp_out; and determining that the output logic equation for the wrapper output element $WO_p$ is the elements of the temporary output list tmp_out multiplexed together if there is more than one element in the temporary output list tmp_out.

In particular embodiments, the methods as described above are implemented into a computer aided design tool, such as an EDA tool, comprising: a processor; and a memory, coupled to the processor and having computer program code embodied therein for enabling the processor to perform operations in accordance with those methods. In alternative embodiments, the methods as described above are implemented as a computer program product comprising a computer useable medium having computer program code embodied therein for generating a circuit wrapper for an integrated circuit element.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

FIG. 2 illustrates an example dataset describing a mapping relationship between an example circuit wrapper and an example integrated circuit element.

FIG. 5 illustrates an example table generated during the operation of and in accordance with an embodiment of the invention.

FIG. 6A illustrates an example table generated during the operation of and in accordance with an embodiment of the invention.

FIG. 6B illustrates an example circuit wrapper generated around an example integrated circuit element by an embodiment of the invention in FIG. 6A using the table illustrated in FIG. 6A.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed toward a system and method for automated synthesizing of a circuit wrapper for an integrated circuit element, where the circuit wrapper contains circuit logic for controlling I/O access to the integrated circuit element the wrapper surrounds.

Embodiments of the present invention are applicable to generating both general circuit wrappers and specific circuit test wrappers. The integrated circuit element is connected to the circuit wrapper via wrapper cells, which connect the circuit wrapper directly to the integrated circuit element's various inputs and outputs (e.g., serial inputs/outputs, I/O pins). The circuit wrappers generated can have a variety of inputs and outputs including, but not limited to, serial inputs, serial outputs, parallel inputs, and parallel outputs. Depending on the embodiment, these wrapper inputs and outputs allow access to circuit wrapper's various components (e.g., wrapper instruction register) and the integrated circuit element. Control logic generated within the circuit wrapper maps the wrapper inputs and outputs to inputs and outputs of an integrated circuit element.

Circuit wrappers generated by embodiments of the present invention have at least one wrapper instruction register (WIR) to control the logic of the circuit wrapper. The control logic configures itself according to the instruction (i.e., wrapper instruction) presently loaded into the wrapper instruction register. Hence, when a serial mode wrapper instruction is loaded into the wrapper instruction register, the circuit wrapper serial inputs and outputs may operate as serial shift registers (also referred to as scan chains). Alternatively, when a parallel mode wrapper instruction is loaded into the wrapper instruction register, the circuit wrapper parallel inputs and outputs may operate as one or more scan segments.

Figure 1:
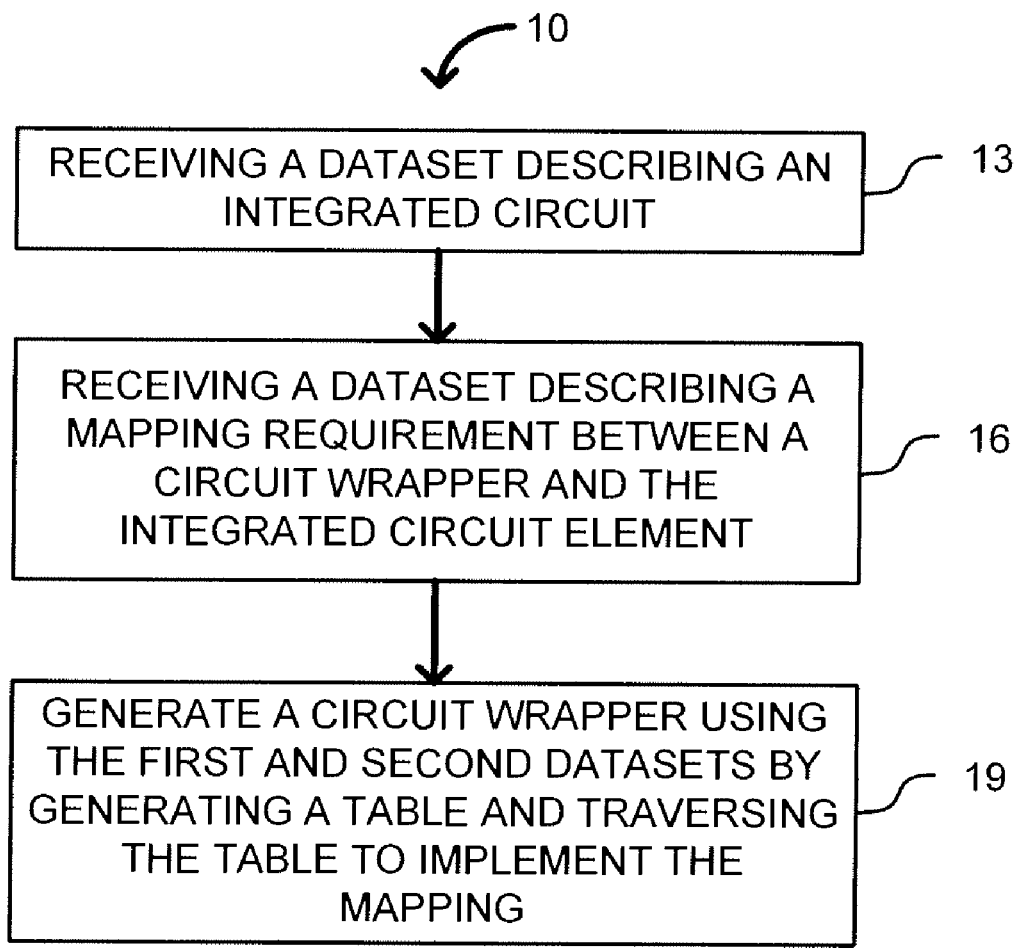
FIG. 1 illustrates an example method for generating a circuit wrapper for an integrated circuit element in accordance with an embodiment of the invention.

Referring now to FIG. 1, an example method 10 for generating a circuit wrapper in accordance with an embodiment of the invention is illustrated. This method can be implemented as a stand-alone tool or a tool incorporated into a circuit design tool. The method 10 begins with the receipt of a first dataset describing an integrated circuit at operation 13. The integrated circuit element may be described in a variety of way including, without limitation, the input specification and output specification of the integrated circuit element or as a circuit layout. For example, in some instances the first dataset is merely text file I/O listing specification, while in other instances the first dataset is a circuit layout schematic file.

In operation 16, the method 10 receives a second dataset containing a mapping relationship between the desire circuit wrapper and the integrated circuit element with which the circuit wrapper is to interface. FIG. 2 illustrates an example of such a dataset. Referring now to FIG. 2, the dataset received in operation 16 describes the circuit wrapper's functionality in terms of wrapper instruction 25 (e.g., WP_INTEST_WP_EXTEST, WS_INTEST_SCAN). The functional inputs 20 and functional outputs 22 of the integrated circuit element (in this case a circuit core) are mapped to the circuit wrapper by way of one or more segment IDs, which are mapped 23 to specific parallel input/output pins of the circuit wrapper. For the serial inputs and outputs, there is a section describing the scan (or serial) inputs/outputs 21 of the integrated circuit element and mapping them to the scan inputs (e.g., SI1, SI2) and scan outputs (e.g., SO1, SO2) of the circuit wrapper. This particular dataset also defines the wrapper instruction register (WIR) size and provides a wrapper by-pass register (24) that when enabled allows the circuit wrapper to be entirely bypassed within a daisy chain of circuit wrappers.

It should be noted that for certain embodiments, the first and second datasets may be received by way of a single data source (e.g., a single file, a single table in a database, or a single database). Furthermore, the datasets may be intermingled within the single data source, which may require an extrapolation process to obtain the separate datasets. For other embodiments, the first and second datasets may be provided by two or more data sources.

Using the first and second datasets provided, operation 19 is able to generate a circuit wrapper for the integrated circuit element that operates in accordance with the mapping relationships provided. In order to do so, operation 19 generates a table (often referred to herein as table T) that maps out the wrapper inputs/outputs to the integrated circuit element inputs/outputs for specific wrapper instructions. After generation, the table is subsequently traversed in accordance with invention as to result in the generation of logic equations that implement the mapping relationships provided. These logic equations are subsequently used to implement control logic between the wrapper inputs/outputs and the integrated circuit element inputs/outputs that is controlled by the wrapper instruction register.

Figure 3:
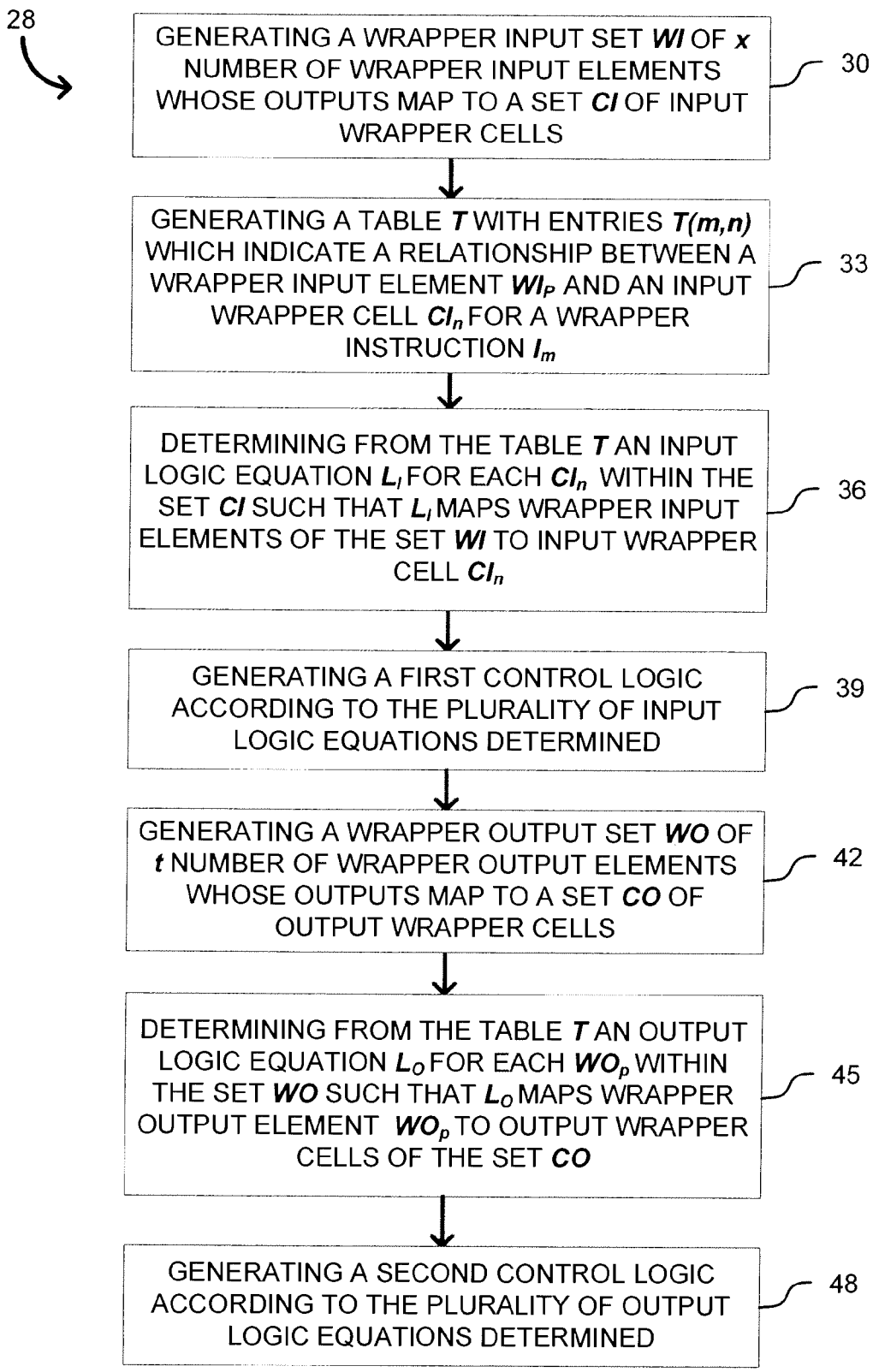
FIG. 3 illustrates an example method for generating control logic for a circuit wrapper in accordance with an embodiment of the invention.

With regard to generation of the table and the logic equations for the control logic, we now refer to FIG. 3, which illustrates an example method 28 for generating control logic for a circuit wrapper in accordance with an embodiment of the invention. The method 28 begins with the generation of a wrapper input set WI which contains x number of wrapper input elements of the circuit wrapper whose outputs map to a set of input wrapper cells (CI). As noted previous, the wrapper cells are points within the circuit wrapper that connect the integrated circuit element inputs/outputs to the circuit wrapper. Input wrapper cells, as the name suggests, are those wrapper cells that connect to the integrated circuit element inputs.

Next, during operation 33, the method 28 generates a table T to indicate the relationship between the wrapper input elements of set WI and the input wrapper cells of set CI for wrapper instructions of set I. FIG. 5 illustrates an example of such a table T generated during the operation of and in accordance with an embodiment of the invention. As illustrated in the table of FIG. 5, the rows of table T correlate to the wrapper instructions and the columns of table T correlate to the input wrapper cell. The entry T(m,n) indicates the wrapper input that maps to the wrapper cell $CI_n$ for a give wrapper instruction $I_m$. Note that other embodiments of the invention can be configured to generate a table T where the rows of table T correlate to the input wrapper cells and the columns of table T correlate to the wrapper instructions. In such embodiments, the example method of FIG. 3 may operate on the table T after a slight modification to the method.

Continuing with FIG. 3, the table T is generated such that each entry T(m,n) equals a wrapper input element $WI_p$ to indicate a relationship between the wrapper input element $WI_p$ and an input wrapper cell $CI_n$ for a specific wrapper instruction $I_m$. If no such relationship exists, the entry T(m,n) may be left blank or provided with a value that expressly indicates the lack of a relationship (e.g., "−1"). Where there is no relationship between a wrapper instruction and an input wrapper cell (e.g., value is "−1"), the cell is considered bypassed.

Upon generation of table T, method 28 continues with operation 36 where input related logic equations are determined. From the table T, an input logical equation $L_i$ is determined for each input wrapper cell $CI_n$ within the set CI such that $L_i$ maps various wrapper input elements within set WI to input wrapper cell $C_n$.

Figure 4:
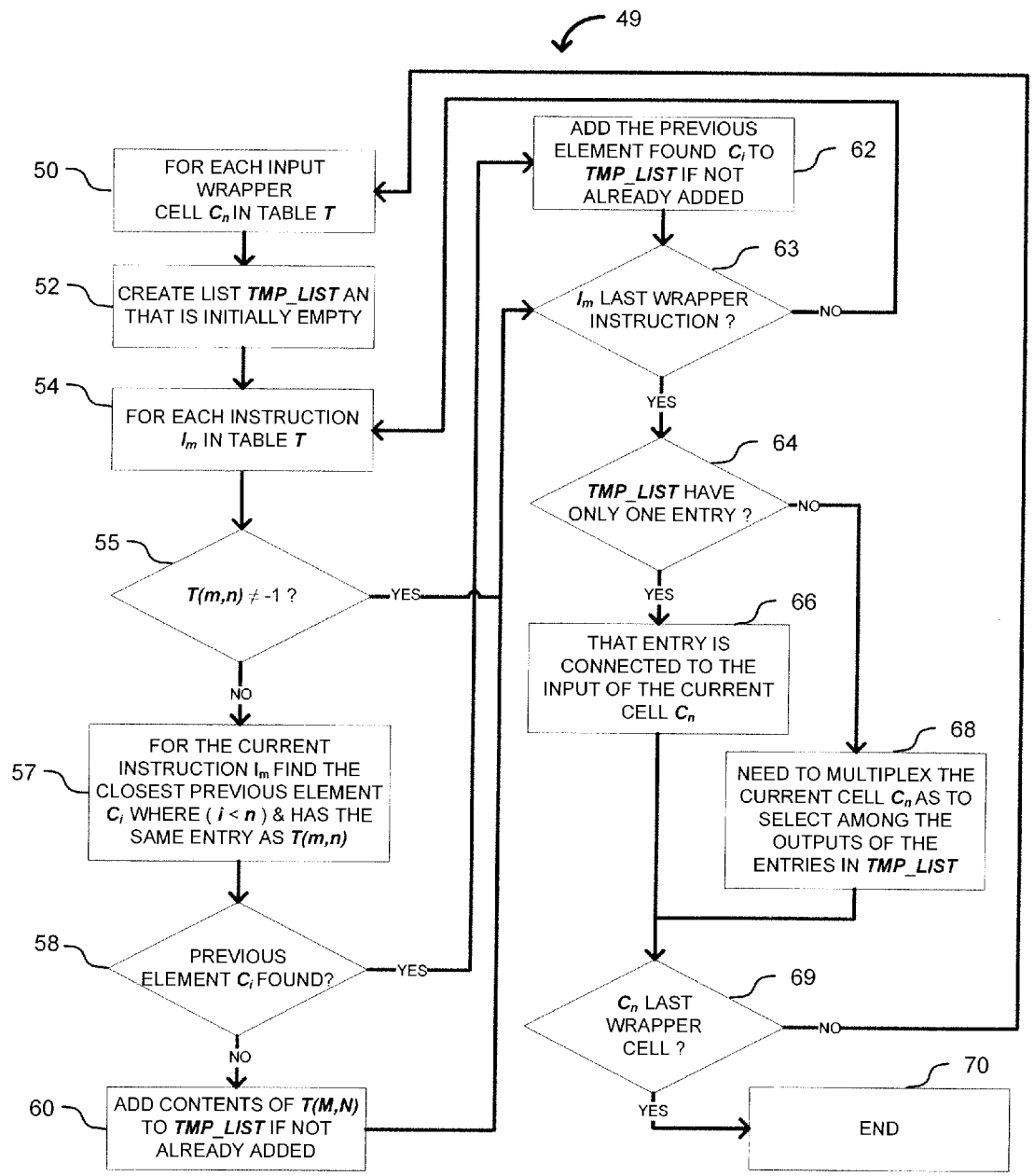
FIG. 4 illustrates an example method for determining a logic equation for a control logic in accordance with an embodiment of the invention.

In some embodiments, the method for determining such a logic equation $L_i$ from table T can be implemented as illustrated in FIG. 4. FIG. 4 illustrates an example method 49 for determining a logic equation for a control logic in accordance with an embodiment of the invention. Referring now to FIG. 4, the method 49 begins at operation 50 by selecting an input wrapper cell $C_n$ from table T. If this is the first iteration of method 49, the first input wrapper cell from table T is selected. If, however, this is a subsequent iteration, the next input wrapper cell (e.g., n=n+1) from table T is selected. The selected input wrapper cell $C_n$ is designated the current cell $C_n$.

After selecting a current wrapper cell $C_n$, operation 52 creates a temporary list (e.g., TMP_LIST) that is initially empty but will eventually store a list of wrapper cells as method 49 progresses. At operation 54, the method 49 selects a wrapper instruction $I_m$ from table T. If this is the first iteration of operation 54, the first wrapper instruction from table T is selected. If, however, this is a subsequent iteration, the next wrapper instruction (e.g., m=m+1) from table T is selected. The selected wrapper instruction $I_m$ is designated the current wrapper instruction $I_m$.

At operation 55, method 49 determines whether the table entry T(m,n) has wrapper input listed. As previously noted, where the wrapper cell is bypassed during a specific wrapper instruction, a number of values can be used in the table entry. In the illustrated example, the value "−1" is used to mark input wrapper cells that are bypassed for a given wrapper instruction. If the table entry T(m,n) has a wrapper input, operation 57 attempts to find the closest previous element $C_i$ where (i<n) and the entry of $C_i$ is same as T(m,n). If the table entry T(m,n) has no wrapper input (e.g., "−1"), method 49 moves to operation 63 where it is determined if there are any more wrapper instructions left. More with respect to operation 63 is detailed later below.

If a previous element $C_i$ is located, the previous element $C_i$ found is added to TMP_LIST at operation 62 if it has not already been added. If a previous element $C_i$ is not located, the contents of the table entry T(m,n) (i.e., an input wrapper) is added to the TMP_LIST at operation 60 if it has not already been added. Method 49 then moves to the next wrapper instruction $I_m$ (i.e., m=m+1) at operation 63 if one exists. If a subsequent wrapper instruction exists in table T, method 49 returns to operation 54 to select the next wrapper instruction $I_m$. If, however, wrapper instruction $I_m$ was the last wrapper instruction, the method 49 continues with operation 64.

At operation 64, method 49 determine if only one entry exists in the final TMP_LIST. If only one entry exists in TMP_LIST, operation 66 connects that entry to the input of the current cell $C_n$. If, however, more than one entry exists in TMP_LIST, operation 68 multiplexes the current cell $C_n$ as to select among the outputs of the entries within TMP_LIST. Depending on the embodiment, operation 68 can utilize an arrangement of multiplexers to multiplex the outputs of the entries within TMP_LIST into current cell $C_n$.

In yet other embodiments, the multiplexing can be simplified by using the fact that at any given moment only one wrapper instruction be active. In such embodiments, an OR-AND-OR gate network is utilized to determine the data input to the wrapper cells based on the wrapper instruction. For example, referring again to FIG. 5, scan chain SC1 (via its scan chain input—i.e., SI1) receives data from WPI[1] during instruction I2 (WP_INTEST), and data from output of wrapper cell WC2 during instruction I4 (WS_INTEST_SCAN). Note, within this example table, "−1" indicates the lack of a relationship between the wrapper instruction and the input wrapper cell. The resulting logic equations for each of input wrapper cells in FIG. 5 are as follows:

$$WC1=((I1+I2)*WPI[0])+((I3+I4+I5)*WSI)$$

$$WC2=(I1+I2+I3+I4+I5)*WC1$$

$$SC1=(I2*WPI[1])+(I4*WC2)$$

$$SC2=(I2*WPI[2])+(I4*SC1)$$

$$WC3=*(I1*WPI[1])+((I2+I3+I5)*WC2)+(I4*SC2)$$

$$WC4=*(I1*WPI[2])+((I2+I3+I4+I5)*WC3)$$

In the above logic equations, "*" represents an AND gate and "+" represents an OR gate. It should be noted that reordering the columns in table T may change the position or number of the multiplexing components (e.g., AND gates, OR gate, multiplexers) that need to be inserted. It should also be noted that throughout this description, when an equation or table refers to a scan chain (SC), it should be understood that each scan chain (SC) has a scan chain serial input pin (SI) and a scan chain serial output pin (SO). These scan chain pins function such that when a scan chain (SC) is providing data, the data is sent from that scan chain's serial output (SO), and when the scan chain (SC) is receiving data, the data is received through the scan chain's serial input (SI).

After operation 66 or operation 69, the method 49 determines if there are any remaining input wrapper cells remaining in the table T to process. If the current cell $C_n$ is the last input wrapper cell, the method ends at operation 70. If, however, another wrapper cells remaining in the table T, the method 49 begins again at operation 50 by selecting the next input wrapper cell $C_n$ (i.e., n=n+1). It should be noted that although the example method of FIG. 4 illustrates a method for generating logic equations for the input wrapper cells, a similar method (not shown) could be used to generate logic equations for mapping the output wrapper cells to the circuit wrappers inputs/outputs.

Continuing with FIG. 3, after input logic equations are determined in operation 36 for each input wrapper cell $C_n$, operation 39 generates a first control logic based on the plurality of input logic equations that resulted. This first control logic is to connect the various wrapper input elements to the input wrapper cells.

Next, in operation 42 we begin with the generation of a wrapper output set WI that contains t number of wrapper output elements of the circuit wrapper whose outputs map to a set of output wrapper cells (CI). As previously noted, the wrapper cells are points within the circuit wrapper that connect the integrated circuit element inputs/outputs to the circuit wrapper. Output wrapper cells are those wrapper cells that connect to the integrated circuit element outputs.

Using the table T generated in operation 33, method 49 determines from the table T an output logical equation $L_o$ for each wrapper output element $WO_p$ within the set WO such that $L_o$ maps various output wrapper cells within the set CO to wrapper output element $WO_p$. In some embodiments, the method for determining such a logic equation $L_o$ from table T comprises the following for each wrapper output element $WO_p$ within set WO: loop through each row (i.e., each wrapper instruction) in the table T to find the last entry in the table that contains a wrapper input element $WI_p$ that correspond to $WO_p$. For example, if the current wrapper output element $WO_p$ was WPO[2] (i.e., wrapper parallel output, pin 2), then its corresponding wrapper input element $WI_p$ would be WPI[2]. The output wrapper cell that corresponds to this located last entry would be the last bit in the chain of output wrapper cells that drives the current wrapper output element $WO_p$. Returning to our example, for the table illustrated in FIG. 5, the output wrapper cell that corresponds to WPI[2] is $WC_4$. If a last entry exists, add it to the TMP_LIST for the current wrapper output element $WO_p$ if it does not already exist. If it is, however, determined that a corresponding $WI_p$ is never found in the table for the current wrapper output element $WO_p$, this is an indication that the current wrapper output element $WO_p$ is not used that wrapper instruction. As this process is repeated for every row of the table for the current wrapper output element $WO_p$, the resulting TMP_LIST contains all the output wrapper cells that will be multiplexed as inputs into the current wrapper output element $WO_p$.

To better illustrate some of the methods provided herein, the methods for generating logic equations will now be applied to the example generated table of FIG. 6A. Using a method similar to that illustrated in FIG. 4, the TMP_LIST could look as follows for the each of the input wrapper cells (i.e., WC1, WC2, WC3, WC4, SC1, SC2, WC5, WC6, WC7) of FIG. 6A:

| | | |
|---|---|---|
| WC1 = WPI[0], WSI | WC4 = WC3 | WC5 = WC4, SC2 |
| WC2 = WC1 | SC1 = WPI[1], WC4 | WC6 = WC2, WC5 |
| WC3 = WPI[1], WC2 | SC2 = WPI[2], SC1 | WC7 = WC6 |

Again, as previously noted, it should be understood that when referring to a scan chain (SC) within this table, if a scan chain (SC) is providing data, the data is sent from that scan chain's serial output (SO), and if the scan chain (SC) is receiving data, the data is received through the scan chain's serial input (SI).

So, for example, SC2=WPI[2], SC1 in the above TMP_LIST translates to SI2 receiving data from either WPI[2] or SO1.

Continuing with reference to the table of FIG. 6A, assuming that the circuit wrapper described by the table of FIG. 6A has three wrapper parallel outputs (i.e., WPO[0], WPO[1], and WPO[2]), the TMP_LIST that would result would look as follows for each of the wrapper parallel outputs:

| | | |
|---|---|---|
| WPO[0] = WC7 | WPO[1] = WC5, SC1 | WPO[2] = SC2 |

Based on these results, it is determined that some fommr of multiplexing will need to be placed before the wrapper cells WC1, WC3, SC1, SC2, WC5, and WC6, and before WPO[1]. After determining the logic equations for WC1, WC3, SC1, SC2, WC5, WC6, and WPO[1], and generating the corresponding control logic, a circuit wrapper can be generated. FIG. 6B illustrates such a circuit wrapper generated by an embodiment of the invention using the table illustrated in FIG. 6A.

Referring now to FIG. 6B, the circuit wrapper 71 "wraps" the integrated circuit element 73 with circuit wrapper inputs and outputs. The circuit wrapper is equipped with a wrapper bypass register (WBY), a wrapper instruction register (WIR), wrapper parallel inputs 76, a wrapper serial input 79, wrapper parallel outputs 82, and a wrapper serial output 85. As illustrated, the integrated circuit element connects to the circuit wrapper 71 through wrapper cells 88 and through serial inputs 91 and outputs 92, which may also be accessed through wrapper cells. The serial inputs 91 (SI1 and SI2) and outputs 92 (SO1 and $SO_2$) allow access to scan chains (scan chain 94—SC1, scan chain 97—SC2) within the integrated circuit element 73. In this illustrated example circuit wrapper 71, multiplexers 79 are utilized to implement the control logic generated in accordance with one embodiment of the invention.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 7:
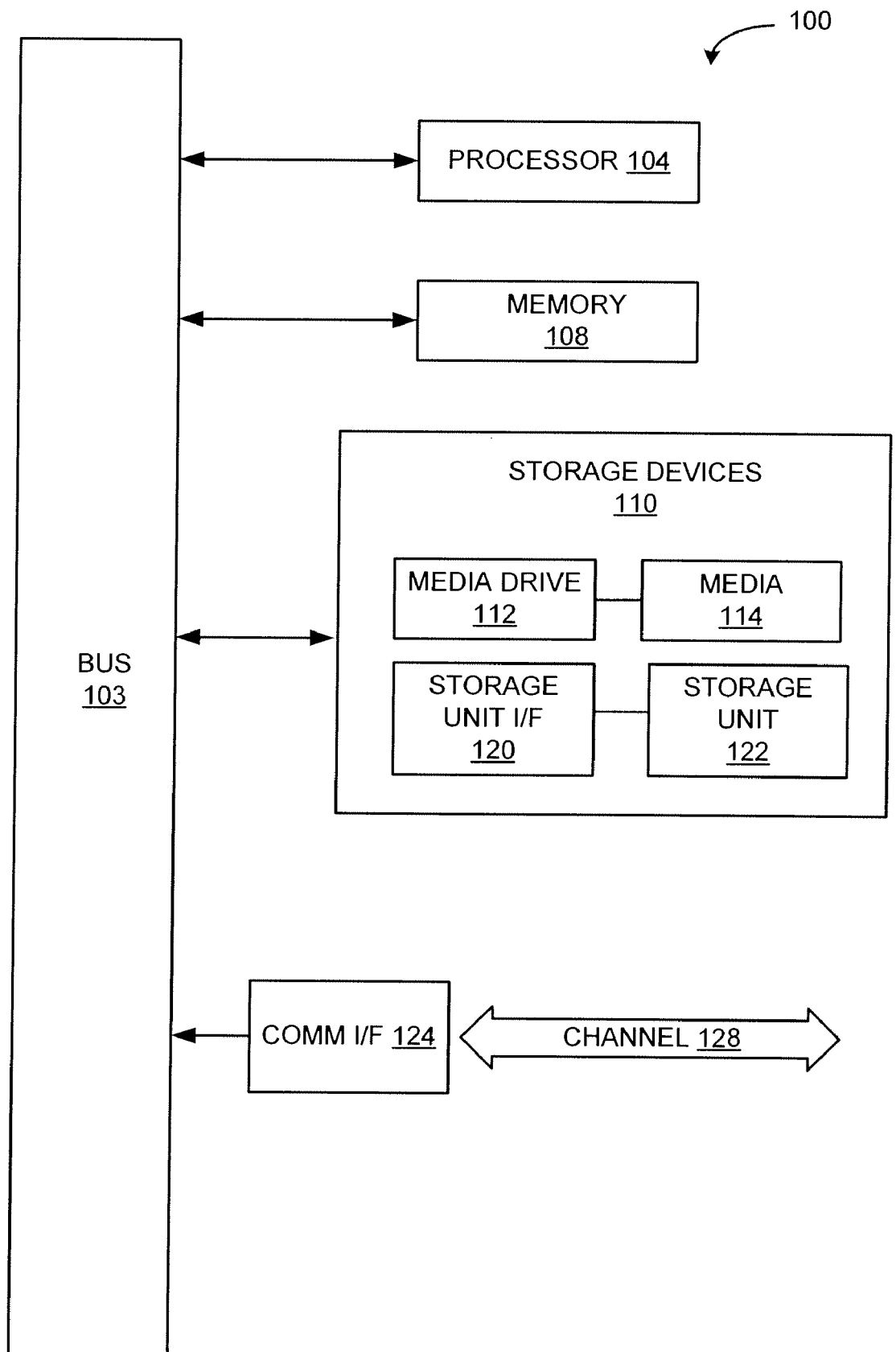
FIG. 7 illustrates an example computing module with which various embodiments of the invention may be implemented.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example-computing module is shown in FIG. 7. Various embodiments are described in terms of this example-computing module 100. After reading this description, it will become apparent to a person skilled in the relevant art how to implement the invention using other computing modules or architectures.

Referring now to FIG. 7, computing module 100 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 100 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 100 might include, for example, one or more processors, controllers, control modules, or other processing devices, such as a processor 104. Processor 104 might be implemented using a general-purpose or special-purpose processing engine such as, for example, a microprocessor, controller, or other control logic. In the example illustrated in FIG. 7, processor 104 is connected to a bus 103, although any communication medium can be used to facilitate interaction with other components of computing module 100 or to communicate externally.

Computing module 100 might also include one or more memory modules, simply referred to herein as main memory 108. For example, preferably random access memory (RAM) or other dynamic memory, might be used for storing information and instructions to be executed by processor 104. Main memory 108 might also be used for storing temporary variables or other intermediate information during execution of instructions to be executed by processor 104. Computing module 100 might likewise include a read only memory ("ROM") or other static storage device coupled to bus 103 for storing static information and instructions for processor 104.

The computing module 100 might also include one or more various forms of information storage mechanism 110, which might include, for example, a media drive 112 and a storage unit interface 120. The media drive 112 might include a drive or other mechanism to support fixed or removable storage media 114. For example, a hard disk drive, a floppy disk drive, a magnetic tape drive, an optical disk drive, a CD or DVD drive (R or RW), or other removable or fixed media drive might be provided. Accordingly, storage media 114, might include, for example, a hard disk, a floppy disk, magnetic tape, cartridge, optical disk, a CD or DVD, or other fixed or removable medium that is read by, written to or accessed by media drive 112. As these examples illustrate, the storage media 114 can include a computer usable storage medium having stored therein computer software or data.

In alternative embodiments, information storage mechanism 110 might include other similar instrumentalities for allowing computer programs or other instructions or data to be loaded into computing module 100. Such instrumentalities might include, for example, a fixed or removable storage unit 122 and an interface 120. Examples of such storage units 122 and interfaces 120 can include a program cartridge and cartridge interface, a removable memory (for example, a flash memory or other removable memory module) and memory slot, a PCMCIA slot and card, and other fixed or removable storage units 122 and interfaces 120 that allow software and data to be transferred from the storage unit 122 to computing module 100.

Computing module 100 might also include a communications interface 124. Communications interface 124 might be used to allow software and data to be transferred between computing module 100 and external devices. Examples of communications interface 124 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 124 might typically be carried on signals, which can be electronic, electromagnetic (which includes optical) or other signals capable of being exchanged by a given communications interface 124. These signals might be provided to communications interface 124 via a channel 128. This channel 128 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to physical storage media such as, for example, memory 108, storage unit 120, and media 114. These and other various forms of computer program storage media or computer usable storage media may be involved in storing and providing one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 100 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

What is claimed is:

1. A computer-implemented method for generating a circuit wrapper for an integrated circuit element, comprising:
   receiving at a computer system a first dataset describing an integrated circuit element, wherein the first dataset describes at least one input specification and at least one output specification of the integrated circuit element;
   receiving at the computer system a second dataset describing a mapping relationship between the circuit wrapper and the integrated circuit element, wherein the circuit wrapper comprises a wrapper instruction register for loading a wrapper instruction, a wrapper input, and a wrapper output, the second dataset defines a set of wrapper instructions, and the mapping relationship maps, for a wrapper instruction from the set of wrapper instructions, the wrapper input to at least one integrated circuit input and the wrapper output to at least one integrated circuit output; and
   generating at the computer system the circuit wrapper using the first and second datasets, wherein a table is generated from the first and second dataset and the table is traversed in order to implement the mapping into the circuit wrapper by using control logic to multiplex the wrapper input and the wrapper output.

2. The method of claim 1, wherein the wrapper input is a wrapper parallel input or a wrapper serial input.

3. The method of claim 1, wherein the wrapper output is a wrapper parallel output or a wrapper serial output.

4. The method of claim 1, wherein the integrated circuit input or the integrated circuit output is an input scan chain, an output scan chain, an input pin, or an output pin.

5. The method of claim 1, wherein a set CI of y input wrapper cells connects the integrated circuit input to the circuit wrapper and a set CO of u number of output wrapper cells connects the integrated circuit output to the circuit wrapper.

6. The method of claim 5, wherein the set of input wrapper cells form a wrapper input register and the set of output wrapper cells forms a wrapper output register.

7. The method of claim 5, wherein generating the circuit wrapper comprises:
   generating and placing within the circuit wrapper a first control logic in accordance with the second dataset, wherein the first control logic is controlled by wrapper instruction presently loaded in the wrapper instruction register, the first control logic is placed between the set CI of input wrapper cells and the wrapper input, and the first control logic implements a mapping between the wrapper input and input of the integrated circuit element via the set CI of input wrapper cells; and
   generating and placing within the circuit wrapper a second control logic in accordance with the second dataset, wherein the second control logic is controlled by a wrapper instruction presently loaded in the wrapper instruction register, the second control logic is placed between set CO of output wrapper cells and the wrappers output, and the second control logic implements a mapping between the wrapper output and output of the integrated circuit element via the set CO of output wrapper cells.

8. The method of claim 7, wherein the first control logic and second control logic comprises logic selected from the group consisting of multiplexers, AND gates, OR gates, NAND gates, and NOR gates.

9. The method of claim 7, wherein generating the first control logic according to the first and second dataset comprises:
   generating from the wrapper input a set WI of x number of wrapper input elements whose outputs map to the set CI of input wrapper cells;
   generating the table T, wherein each entry $T(m, n)$ of the table indicates a relationship between a wrapper input element $WI_p$ and an input wrapper cell $CI_n$ for a given wrapper instruction $I_m$;
   determining from the table T an input logic equation for each input wrapper cell $CI_n$ within the set CI such that the input logic equation maps wrapper input elements of the WI to input wrapper cell $CI_n$, thereby resulting in a plurality of input logic equations that map wrapper input elements of the set WI input wrapper cells of the set CI; and
   generating the first control logic according to the plurality of input logic equations.

10. The method of claim 9, wherein determining from the table T an input logic equation for each input wrapper cell $CI_n$ from n=1 to x comprises:
   creating a temporary input list tmp_in, wherein the temporary input list is initially empty for each input wrapper cell $CI_n$;
   performing for each wrapper instruction $I_m$ from m=1 to z where the following operations:
      attempting to locate a closest previous wrapper cell $CI_i$ where i<n and $T(m, n)$ is the same as $T(m, i)$,
      adding $T(m, n)$ to the temporary input list tmp_in if $CI_i$ is not located and $T(m, n)$ has not already been added to the temporary input list tmp_in, and
      adding $CI_i$ to the temporary input list tmp_in if $CI_i$ is located and $C_i$ has not already been added to the temporary input list tmp_in; and
   determining that the logic equation for the input wrapper cell $C_n$ is $T(m, n)$ if the temporary list tmp_in contains only one element; and
   determining that the input logic equation for the input wrapper cell $C_n$ is the elements of the temporary input list tmp_in multiplexed together if there is more than one element in the temporary input list tmp_in.

11. The method of claim 10, wherein the elements of the temporary input list tmp_in are multiplexed together using multiplexers.

12. The method of claim 10, wherein the elements of the temporary input list tmp_in are multiplexed together using an OR-AND-OR gate network.

13. The method of claim 9, wherein generating the second control logic according to the first and second dataset comprises:
generating from the wrapper output a set WO of t number of wrapper output elements whose inputs map to the set CO of output wrapper cells;
determining from the table T an output logic equation for each wrapper output element $WO_p$ within the set WO such that the output logic equation maps wrapper output element $WO_p$ to output wrapper cells of the set CO, thereby resulting in a plurality of output logic equations that map wrapper output elements of the set WO to output wrapper cells of the set CO; and
generating the second control logic according to the plurality of output logic equations.

14. The method of claim 13, wherein determining from the table T an output logic equation for each wrapper output element $WO_p$ from p=1 to t comprises:
creating a temporary output list tmp_out, wherein the temporary output list is initially empty for each wrapper output element $WO_p$;
performing for each wrapper instructions $I_m$ from m=1 to z where the following operations:
attempting to locate a last entry T(m, j) where j≦y and the wrapper input element $WI_o$ within T(m, j) corresponds to the wrapper output element $WO_p$, and
adding $C_j$ to the temporary output list tmp_out if $C_j$ is located and $C_j$ has not already been added to the temporary output list tmp_out, and
determining that the output logic equation for the wrapper output element $WO_p$, is the elements of the temporary output list tmp_out multiplexed together if there is more than one element in the temporary output list tmp_out.

15. The method of claim 1, wherein the circuit wrapper generated is in accordance with IEEE 1500.

16. The method of claim 1, wherein the integrated circuit element is an entire integrated circuit or a circuit core of a system-on-chip.

17. A computer program product comprising a non-transitory computer useable storage medium having computer program code embodied therein which, when implemented on a computer, performs a method for generating a circuit wrapper for an integrated circuit element, the method comprising:
receiving at the computer a first dataset describing an integrated circuit element, wherein the first dataset describes at least one input specification and at least one output specification of the integrated circuit element;
receiving at the computer a second dataset describing a mapping relationship between the circuit wrapper and the integrated circuit element, wherein the circuit wrapper comprised a wrapper instruction register for loading a wrapper instruction, a wrapper input, and a wrapper output, the second dataset defines a set of wrapper instructions, and the mapping relationship maps, for a wrapper instruction from the set of wrapper instructions, the wrapper input to at least one integrated circuit input and the wrapper output to at least one integrated circuit output; and
generating at the computer the circuit wrapper using the first and second datasets, wherein a table is generated from the first and second dataset and the table is traversed in order to implement the mapping into the circuit wrapper by using control logic to multiplex the wrapper input and the wrapper output.

18. The computer program product of claim 17, wherein the wrapper input is a wrapper parallel input or a wrapper serial input.

19. The computer program product of claim 17, wherein the wrapper output is a wrapper parallel output or a wrapper serial output.

20. The computer program product of claim 17, wherein the integrated circuit input or the integrated circuit output is an input scan chain, an output scan chain, an input pin, or an output pin.

21. The computer program product of claim 17, wherein a set CI of y input wrapper cells connects the integrated circuit input to the circuit wrapper and a set CO of u number of output wrapper cells connects the integrated circuit output to the circuit wrapper.

22. The computer program product of claim 21, wherein the set of input wrapper cells form a wrapper input register and the set of output wrapper cells form a wrapper output register.

23. The computer program product of claim 21, wherein generating the circuit wrapper comprises:
generating and placing within the circuit wrapper a first control logic in accordance with the second dataset, wherein the first control logic is controlled by a wrapper instruction presently loaded in the wrapper instructions register, the first control logic is placed between the set CI of input wrapper cells and the wrapper input, and the first control logic implements a mapping between the wrapper input and input of the integrated circuit element via the set CI of input wrapper cells; and
generating and placing within the circuit wrapper a second control logic in accordance with the second dataset, wherein the second control logic is controlled by a wrapper instruction presently loaded in the wrapper instruction register, the second control logic is placed between set CO of output wrapper cells and the wrapper output, and the second control logic implements a mapping between the wrapper output and output of the integrated circuit element via the set CO of output wrappers cells.

24. The computer program product of claim 23, wherein the first control logic and second control logic comprises logic selected from the group consisting of multiplexers, AND gates, OR gates, NAND gates, and NOR gates.

25. The computer program product of claim 23, wherein generating the first control logic according to the first and second dataset comprises:
generating from the wrapper input a set WI of x number of wrapper input elements whose outputs map to the set CI of input wrapper cells;
generating the table T, wherein each entry T(m, n) of the table indicates a relationship between a wrapper input element $WI_p$ and an input wrapper cell $CI_n$ for a given wrapper instruction $I_m$;
determining from the table T an input logic equation for each input wrapper cell $CI_n$ within the set CI such that the input logic equation maps wrapper input elements of the set WI input wrapper cell $CI_n$, thereby resulting in a plurality of input logic equations that map wrapper input elements of the set WI input wrapper cells of the set CI; and
generating the first control logic according to the plurality of input logic equations.

26. The computer program product of claim 25, wherein determining from the table T an input logic equation for each input wrapper cell $CI_n$ from n=1 to x comprises:
- creating a temporary input list tmp_in, wherein the temporary input list is initially empty for each input wrapper cell $CI_n$;
- performing for each wrapper instruction $I_m$ from m=1 to z where the following operations:
  - attempting to locate a closest previous wrapper cell $CI_i$ where i<n and T(m, n) is the same as T(m, i),
  - adding T(m, n) to the temporary input list tmp_in if $CI_i$ is not located and T(m, n) has not already been added to the temporary input list tmp_in, and
  - adding $CI_i$ to the temporary input list tmp_in if $CI_i$ is located and $C_i$ has not already been added to the temporary input list tmp_in; and
- determining that the logic equation for the input wrapper cell $C_n$ is T(m, n) if the temporary list tmp_in contains only one element; and
- determining that the input logic equation for the input wrapper cell $C_n$ is the elements of the temporary input list tmp_in multiplexed together if there is more than one element in the temporary input list tmp_in.

27. The computer program product of claim 26, wherein the elements of the temporary input list tmp_in are multiplexed together using multiplexers.

28. The computer program product of claim 26 wherein the elements of the temporary input list tmp_in are multiplexed together using an OR-AND-OR gate network.

29. The computer program product of claim 25, wherein generating the second control logic according to the first and second dataset comprises:
- generating from the wrapper output a set WO of t number of wrapper output elements whose inputs map to the set CO of output wrapper cells;
- determining from the table T an output logic equation for each wrapper output element $WO_p$ within the set WO such that the output equation maps wrapper output element $WO_p$ to output wrapper cells of the set CO, thereby resulting in a plurality of output logic equations that map wrapper output element of the set WO to output wrapper cells of the set CO; and
- generating the second control logic according to the plurality of output logic equations.

30. The computer program product of claim 29, wherein determining from the table T an output logic equation for each wrapper output element $WO_p$ from p=1 to t comprises:
- creating a temporary output list tmp_out, wherein the temporary output list is initially empty for each wrapper output element $WO_p$;
- performing for each wrapper instruction $I_m$ from m=1 to z where the following operations:
  - attempting to locate a last entry T(m, j) where j≦y and the wrapper input element $WI_o$ within T(m, j) corresponds to the wrapper output element $WO_p$, and
  - adding $C_j$ to the temporary output list tmp_out if $C_j$ is located and $C_j$ has not already been added to the temporary output list tmp_out, and
- determining that the output logic equation for the wrapper output element $WO_p$ is the elements of the temporary output list tmp_out multiplexed together if there is more than one element in the temporary output list tmp_out.

31. The computer program product of claim 17, wherein the circuit wrapper generated is in accordance with IEEE 1500.

32. The computer program product of claim 17, wherein the integrated circuit element is an entire integrated circuit of a circuit core of a system-on-chip.

33. A computer system for generating a circuit wrapper for an integrated circuit element, comprising:
- a memory configured to store program instructions; and
- a processor coupled to the memory and configured to receive and execute the program instructions, wherein the program instructions cause the processor to perform the operations of:
- receiving at a computer system a first dataset describing an integrated circuit element, wherein the first dataset describes at least one input specification and at least one output specification of the integrated circuit element;
- receiving at the computer system a second dataset describing a mapping relationship between the circuit wrapper and the integrated circuit element, wherein the circuit wrapper comprises a wrapper instruction register for loading a wrapper instruction, a wrapper input, and a wrapper output, the second dataset defines a set of wrapper instructions, and the mapping relationship maps, for a wrapper instruction from the set of wrapper instructions, the wrapper input to at least one integrated circuit input and the wrapper output to at least one integrated circuit output; and
- generating at the computer system the circuit wrapper using the first and second datasets, wherein a table is generated from the first and second dataset and the table is traversed in order to implement the mapping into the circuit wrapper by using control logic to multiplex the wrapper input and the wrapper output.

\* \* \* \* \*

UNITED STATES PATENT AND TRADEMARK OFFICE
CERTIFICATE OF CORRECTION

| | | |
|---|---|---|
| PATENT NO. | : 8,296,694 B1 | Page 1 of 1 |
| APPLICATION NO. | : 12/649816 | |
| DATED | : October 23, 2012 | |
| INVENTOR(S) | : Krishna V. Chakravadhanula et al. | |

It is certified that error appears in the above-identified patent and that said Letters Patent is hereby corrected as shown below:

Col. 16, line 62, after "WI", insert --to--.

Signed and Sealed this
Twenty-ninth Day of January, 2013

David J. Kappos
*Director of the United States Patent and Trademark Office*